United States Patent
Li et al.

(10) Patent No.: US 9,799,743 B1
(45) Date of Patent: Oct. 24, 2017

(54) TRENCHED POWER SEMICONDUCTOR ELEMENT

(71) Applicant: SINOPOWER SEMICONDUCTOR, INC., Hsinchu (TW)

(72) Inventors: Po-Hsien Li, Tainan (TW); Guo-Liang Yang, Hsinchu (TW); Wei-Chieh Lin, Hsinchu (TW); Jia-Fu Lin, Yilan County (TW)

(73) Assignee: SINOPOWER SEMICONDUCTOR, INC., Hsinchu (TW)

( * ) Notice: Subject to any disclaimer, the term of this patent is extended or adjusted under 35 U.S.C. 154(b) by 0 days.

(21) Appl. No.: 15/358,182

(22) Filed: Nov. 22, 2016

(30) Foreign Application Priority Data

Jun. 22, 2016 (TW) .............................. 105119553 A

(51) Int. Cl.
*H01L 29/423* (2006.01)
*H01L 29/40* (2006.01)
*H01L 21/28* (2006.01)
*H01L 21/02* (2006.01)
*H01L 29/51* (2006.01)
*H01L 29/872* (2006.01)
*H01L 29/78* (2006.01)

(52) U.S. Cl.
CPC .... *H01L 29/4236* (2013.01); *H01L 21/02244* (2013.01); *H01L 21/02255* (2013.01); *H01L 21/28273* (2013.01); *H01L 29/408* (2013.01); *H01L 29/42336* (2013.01); *H01L 29/513* (2013.01); *H01L 29/515* (2013.01); *H01L 29/7827* (2013.01); *H01L 29/8725* (2013.01)

(58) Field of Classification Search
None
See application file for complete search history.

(56) References Cited

U.S. PATENT DOCUMENTS

| 9,673,318 | B1 * | 6/2017 | Mirchandani ....... H01L 29/7813 |
| 2007/0194374 | A1 * | 8/2007 | Bhalla .................. H01L 29/407 257/330 |

* cited by examiner

*Primary Examiner* — Angel Roman
*Assistant Examiner* — Kevin Quinto
(74) *Attorney, Agent, or Firm* — Li & Cai Intellectual Property (USA) Office

(57) ABSTRACT

A trenched power semiconductor element, a trenched-gate structure thereof being in an element trench of an epitaxial layer and including at least a shielding electrode, a shielding dielectric layer, a gate electrode, an insulating separation layer, and a gate insulating layer. The shielding electrode is disposed at the bottom of the element trench, the shielding dielectric layer is disposed at a lower portion of the element trench, surrounding the shielding electrode to separate the shielding electrode from the epitaxial layer, wherein the top portion of the shielding dielectric layer includes a hole. The gate electrode is disposed above the shielding electrode, being separated from the hole at a predetermined distance through the insulating separation layer. The insulating separation layer is disposed between the shielding dielectric layer and the gate electrode layer to seal the hole.

15 Claims, 16 Drawing Sheets

US 9,799,743 B1

TRENCHED POWER SEMICONDUCTOR ELEMENT

BACKGROUND OF THE INVENTION

1. Field of the Invention

The instant disclosure relates to a power transistor; in particular, to a trenched power metal-oxide-semiconductor field-effect transistor (MOSFET).

2. Description of Related Art

To reduce the gate/drain capacitance and to increase the breakdown voltage without increasing the on-resistance, prior art power MOSFETs include shielding electrodes at lower portions of gate trenches.

However, normally, during the process of manufacturing trenched power MOSFET with shielding electrode structure, the dielectric layer on the side wall at the upper portion of the gate trench is etched away in advance and then the new gate dielectric layer is deposited, and during the process of etching away the dielectric layer, the depth of etching is difficult to control. An etching that goes too deep will cause holes or slits formed on the gate trench.

The holes or slits are likely to affect the electrical properties of the trenched power MOSFETs. If a voltage is applied to the gate of a MOSFET with holes or slits on its gate trench, these holes and slits may cause leakage currents between the gate and the source such that the MOSFET has poor electrical properties.

SUMMARY OF THE INVENTION

The instant disclosure provides a trenched power semiconductor element, which prevents the holes or slits existing in the trench from affecting the electrical properties of the semiconductor element by means of an insulating separation layer that seals the holes and spaces the gate electrode and the holes apart.

In order to achieve the aforementioned objects, an embodiment of the instant disclosure provides a trenched power semiconductor element including a substrate, an epitaxial layer, and a trenched-gate structure. The epitaxial layer is situated on the substrate and has at least one element trench formed therein. The trenched-gate structure is situated in the at least one element trench and includes a shielding electrode, a shielding dielectric layer, a gate electrode, an insulating separation layer, and a gate insulating layer. The shielding electrode is disposed at a bottom part of the at least one element trench. The shielding dielectric layer is disposed at a lower portion of the element trench and surrounds the shielding electrode so as to separate the shielding electrode from the epitaxial layer, wherein the shielding dielectric layer has at least one hole. The gate electrode is disposed on the shielding electrode and is electronically insulated from the shielding electrode. The insulating separation layer is disposed between the shielding dielectric layer and the electrode gate to seal the at least one hole and to space the gate electrode apart from the at least one hole at a predetermined distance. The gate insulating layer is situated at an upper portion of the element trench and surrounds the gate electrode so as to separate the gate electrode from the epitaxial layer.

In summary, the trenched power semiconductor element provided by the instant disclosure utilizes the insulating separation layer to seal the holes and to space the hold apart from the gate electrode at a predetermined distance so as to prevent the holes from affecting the electrical properties of the element. That is to say, even though there are holes existing in the element trench, the element trench will not affect the electrical performance of the trenched power semiconductor element.

In order to further the understanding of the instant disclosure, the following embodiments are provided along with appended drawings to facilitate the detailed explanation of the instant disclosure.

DETAILED DESCRIPTION OF THE PREFERRED EMBODIMENTS

The aforementioned illustrations and following detailed descriptions are exemplary for the purpose of further explaining the scope of the instant disclosure. Other objectives and advantages related to the instant disclosure will be illustrated in the subsequent descriptions and appended drawings.

Figure 1:
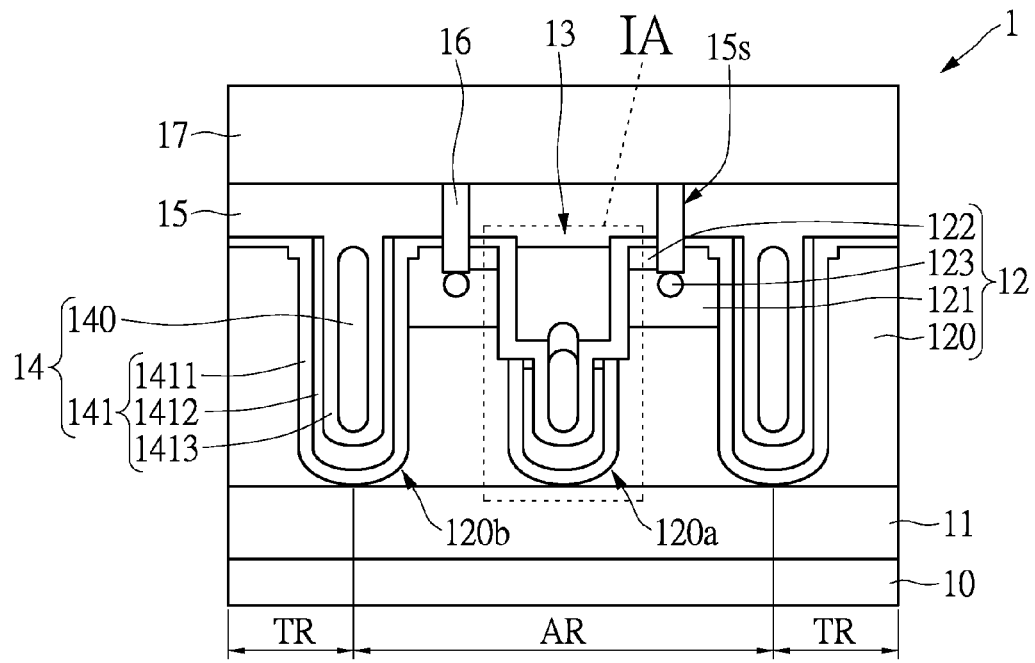
FIG. 1 is a partial section view illustrating a trenched power semiconductor element according to an embodiment of the instant disclosure.
Figure 1A:
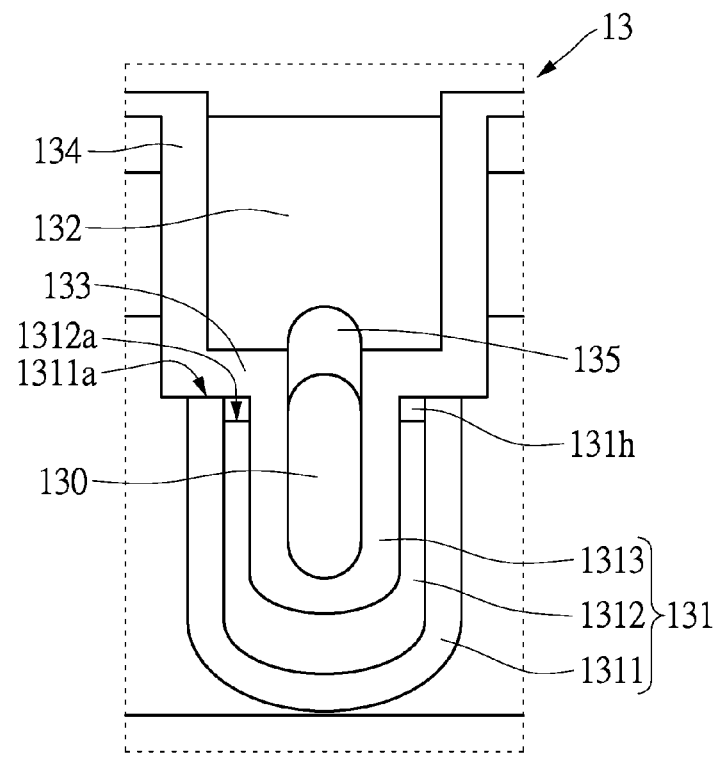
FIG. 1A is a partial enlarged view illustrating the trenched-gate structure marked IA in FIG. 1.

Please refer to FIG. 1 to FIG. 1A. A trenched power semiconductor element 1 includes a substrate 10, an epitaxial layer 12, a trenched-gate structure 13, and a terminal electrode structure 14. The trenched power semiconductor element 1 can be a trenched power transistor or a power semiconductor element with Schottky diodes. In FIG. 1, the trenched power semiconductor element 1 is taken as a trenched power transistor to explain the structure of the trenched power semiconductor element 1.

In FIG. 1, the substrate includes a first conductivity type impurity of high concentration to be the drain of the trenched power semiconductor element. The aforementioned first conductivity type impurity can be n-type conductive impurity or p-type conductive impurity. If the substrate 10 is a silicon substrate, the n-type conductive impurity includes elements with five valence electrons, such as phosphorus and arsenic; the p-type conductive impurity includes element with three valence electrons, such as boron, aluminum, or gallium.

If the trenched power semiconductor element is n-type, the substrate 10 is doped with n-type conductive impurities. On the other hand, if the trenched power semiconductor element if p-type, the substrate 10 is doped with p-type conductive impurities. In the present embodiment, the trenched power semiconductor is n-type.

In the present embodiment, the trenched power semiconductor element 1 further includes a buffer layer 11. The buffer layer 11 has the same conductivity type as the substrate 10 and the epitaxial layer 12. It should be noted that the dopant concentration of the buffer layer 11 is smaller than that of the substrate 10. The buffer layer 11 can reduce on-state source/drain resistance (Rdson), and can thus reduce the power dissipation of the trenched power semiconductor element 1.

The epitaxial layer 12 is situated on the buffer layer 11 and has the same conductivity type as the substrate 10 and the buffer layer 11, but is with a lower dopant concentration than that of the buffer layer 11. Taking the trenched power semiconductor element 11 as an NMOS transistor, the substrate 10 has a high n-type dopant concentration, and the epitaxial layer 12 has a low n-type dopant concentration. Taking the trenched power semiconductor element 11 as a PMOS transistor, the substrate 10 has a high p-type dopant concentration and the epitaxial layer 12 has a low p-type dopant concentration.

Moreover, in the embodiment shown in FIG. 1, the epitaxial layer 12 can be divided into a drift region 120, a body region 121, and a source region 122 by doping, in different regions, conductive impurities of different concentrations and different types. The body region and the source region are formed in a part of the epitaxial layer 12 adjacent to the trenched-gate structure 13, and the drift region 120 is located in a part of the epitaxial layer 12 near the substrate 10. That is to say, the body region 121 and the source region 122 are formed at the upper portion of the epitaxial layer 12, and the drift region 120 is formed at the lower portion of the epitaxial layer 12.

Specifically, the body region 121 is formed by doping the epitaxial layer 12 with a second conductivity type impurity, and the source region 122 is formed by doping the body region 121 with a first conductivity type impurity of high concentration, in which the source region 122 is formed at the upper portion of the body region 121. For instance, if the trenched power semiconductor element 1 is an NMOS transistor, the body region 121 is a p-doped region, such as a P-well, and the source region 122 is an n-doped region. In addition, the dopant concentration of the body region 121 is smaller than that of the source region 122.

Furthermore, in the present embodiment, an active region AR and at least one terminal region TR adjacent to the active region AR are defined in the epitaxial layer 12. The epitaxial layer 12 further includes an element trench 120a situated in the active region AR, and at least one terminal trench 120b situated in the terminal region TR.

The element trench 120a and the terminal trench 120b extend downward from the surface of the epitaxial layer 12 to the drift region 120, and the bottom part of the element trench 120a is closer to the substrate 10 compared to prior art trenched power semiconductor. It should be noted that in the present embodiment, the lower edge of the body region 121 is taken as a reference surface dividing the element trench 120a into an upper portion and a lower portion.

As shown in FIG. 1A, in the present embodiment, at least one trenched-gate structure 13 is disposed in the element trench 120a. The trenched-gate structure 13 includes a shielding electrode 130, a shielding dielectric layer 131, a gate electrode 132, an insulating separation layer 133, and a gate insulating layer 134.

The shielding electrode 130 is situated at the lower portion of the element trench 120a, and the gate electrode 132 is disposed above the shielding electrode 130 and is electrically insulated from the shielding electrode 130. Specifically, the trenched-gate structure 13 further includes an inter-electrode dielectric layer 135 disposed between the shielding electrode 130 and the gate electrode 132 so as to separate the gate electrode 132 from the shielding electrode 130. The material of the inter-electrode dielectric layer can be oxides, such as silicon oxide, nitrogen oxide, or other insulation material. The instant disclosure does not limit the type of the material.

It should be noted that if the element trench 120a is a deep trench structure, the deep trench structure will help increase the breakdown voltage of the trenched power semiconductor element 1, but will also increase the gate/drain capacitance (Cgd) and the Rdson. Accordingly, in one embodiment of the instant disclosure, the shielding electrode is disposed at the bottom part of the element trench 120a so as to reduce gate/drain capacitance (Cgd) and thus reduce power dissipation. Furthermore, the shielding electrode 130 can be electrically connected to the source so as to achieve charge balance in the drift region 120 and to further increase the breakdown voltage. Hence, in order to lower the on-resistance in the drift region 120, the dopant concentration in the drift region 120 can be correspondingly increased.

The shielding dielectric layer 131 is disposed at a lower portion of the element trench 120a and surrounds the shielding electrode 130 so as to separate the shielding electrode 130 from the epitaxial layer 12. In one embodiment of the instant disclosure, the shielding dielectric layer 130 has at least one hole 131h.

Specifically, as shown in FIG. 1, the shielding dielectric layer 131 includes a first material layer 1311, a second material layer 1312, and a third material layer 1313, wherein the second material layer 1312 is disposed between the first material layer 1311 and the third material layer 1313, and the third material layer is disposed between the shielding electrode 130 and the second material layer 1312. That is to say, in the present embodiment, the first material layer 1311, the second material layer 1312, and the third material layer 1313 are disposed in sequence from the inner wall of the element trench 120a to the shielding electrode 130.

It should be noted that the hole 131h is recessed from the end surface of the second material layer 1312, and the opening of the hole 131h faces the shielding electrode 132. That is to say, the end surface 1312a of the second material layer 1312 is lower than the end surface 1311a of the first material layer 131, thereby forming the hole 131h. On the other hand, the position of the hole 131h is lower than the horizontal plane at which the lower edge of the body region 121 is situated.

In the first embodiment, the dielectric constant of the second material layer 1312 is larger than that of the first material layer 1311. That is to say, the material of the first material layer 1311 is different from that of the second material layer 1312, but whether the material of the first material layer 1311 is different from that of the second material layer 1312 is not limited. For instance, the first material layer 1311 and the third material layer 1313 can be but is not limited to oxide layers, e.g. silicon oxide layers, and the second material layer 1312 can be a nitride layer, e.g. silicon nitride layer, or a layer made of other materials with high dielectric constants, such as chromium oxide, yttrium oxide, or aluminum oxide. However, the materials of the first material layer to the third material layer can be different from each other, and the instant disclosure is not limited to the above description.

In the present embodiment, the thickness of the first material layer 1311 and the thickness of the second material layer 1312 determines the maximum operating voltage of the trenched power semiconductor element 1 according to the thickness of the trenched power semiconductor element. The maximum operating voltage usually ranges from 12V to 25V. Specifically, the thickness of the first material layer 1311 ranges from 5 nm to 8 nm, the thickness of the second material layer 1312 ranges from 20 nm to 30 nm, and the thickness of the third material layer 1313 ranges from 60 nm to 120 nm.

As shown in FIG. 1, the insulating separation layer 133 is disposed between the shielding dielectric layer 131 and the gate electrode 132 so as to seal the hole 131h and to space the gate electrode 132 apart from the hole 131h at a predetermined distance.

In the present embodiment, the insulating separation layer 133 is a thermal oxide layer, such as silicon oxide, and the insulating separation layer 133 merely covers the opening of the hole 131h and does not fill the hole 131h.

After a thermal reliability test, it was proven that even though the hole 131h exists in the trenched-gate structure 13, the hole 131h will not affect the electrical properties of the trenched power semiconductor element 1 as long as the gate electrode 132 and the hole 131h are spaced apart at a predetermined distance by the insulating separation layer 133. In one embodiment, the aforementioned predetermined distance is the shortest distance between the gate electrode 132 and the hold 131h. The predetermined distance is 50 nm at least, preferably being in a range from 50 nm to 70 nm. That is to say, the thickness of the insulating separation layer 133 has to be 50 nm at least so as to separate the hole 131h from the gate electrode 132.

In the prior art, during the course of manufacturing trenched power semiconductor elements, efforts were made to fill the hole 131h to prevent the hole 131h from affecting the electrical properties of the element. The technical means adopted by the instant disclosure overcomes this technical prejudice, allowing the hole 131h to exist in the trenched-gate structure 13 while preventing the hole 131h from affecting the electrical properties of the trenched power semiconductor element 1 and enabling the electrical properties of the trenched power semiconductor element 1 to reach an expected level.

The gate insulating layer 134 is situated at the upper portion of the element trench 120a and surrounds the gate electrode 132 so as to separate the gate electrode 132 from the epitaxial layer 12. In one embodiment, the gate insulating layer 134 is a thermal oxide layer made by a thermal oxidation manufacturing process. Since the side wall of the trench is oxidized during the thermal oxidation manufacturing process, the element trench 120a according to one embodiment of the instant disclosure has a wider upper portion and a narrower lower portion. Moreover, the thickness of the gate insulating layer 134 ranges from 25 nm to 60 nm.

With further reference to FIG. 1, in the present embodiment, the trenched power semiconductor element 1 further includes a terminal electrode structure 14 formed in the terminal trench 120b. Specifically, the terminal electrode structure 14 includes a terminal electrode 140 situated in the terminal trench 120b and a terminal dielectric layer 141 for separating the terminal electrode 140 from the epitaxial layer 12.

Furthermore, the terminal dielectric layer 141 is disposed to conform to the inner wall of the terminal trench 120b and has a shape that matches the inner wall of the terminal trench 120b. In the present embodiment, the terminal dielectric layer 141 is a multilayer structure. The multilayer structure is composed of a first dielectric material layer 1411, a second dielectric material layer 1412, and a third dielectric material layer 1413 in sequence from the inner wall of the terminal trench 120b to the terminal electrode 140. That is to say, the second dielectric material layer 1412 of the terminal dielectric layer 141 is disposed between the aforementioned first dielectric material layer 1411 and the third dielectric material layer 1413.

According to one embodiment of the instant disclosure, the trenched power semiconductor element 1 further includes a dielectric interlayer 14, a plurality of conductive insertions 16, and a conductive layer 17.

Please refer to FIG. 1. The dielectric interlayer 15 is formed above the epitaxial layer 12 so as to increase the flatness of the conductive layer 17. The material of the dielectric interlayer 15 is selected from the group consisting of boron-phosphorosilicate glass (BPSG), phosphorosilicate glass (PSG), oxide, and nitride, or a combination thereof.

Furthermore, the dielectric interlayer 15 includes a plurality of contact windows that extend from the upper surface of the dielectric interlayer 15 to the epitaxial layer 12. The plurality of contact windows includes source contact windows, terminal electrode contact windows, and gate contact windows. In the present embodiment, a source contact window is used to explain the instant disclosure.

The source contact window 15s extends to the inside of the epitaxial layer 12 and is formed at a side of the source region 122. Moreover, the epitaxial layer 12 further includes at least one contact doping region 123 situated beneath the source contact window 15s. In one embodiment, the contact doping region 123 is formed by implanting boron difluoride ions (BF2+) into the epitaxial layer 12 through the source contact window 15s.

However, the position of the source contact window 15s can be adjusted according to the design of the element, and is not limited to the embodiment of the instant disclosure. In other embodiments, the source contact window 15s can be situated above the source region 122 so as to directly correspond to the source region 122.

The plurality of conductive insertions 16 are formed separately in the plurality of contact windows. In the present embodiment, the conductive insertions 16 are formed inside the source contact windows 15s and directly contact the source regions 122 and the contact doping regions 123 inside the epitaxial layer 12, whereby ohmic contacts are formed between the conductive insertions 16 and the source regions 122. The material of the conductive insertions 16 is metal, such as tungsten, copper, nickel, or aluminum. However, the material of the conductive insertions 16 is not limited to the above-listed metals.

The conductive layer 17 covers the dielectric interlayer 15 from above, and is electrically connected to the source region 122 through the conductive insertions 16 passing through the dielectric interlayer 15. The conductive layer 17 can be the source electrode of the trenched power semiconductor element 1 and can be electrically connected to a control circuit outside the trenched power semiconductor element 1. The material of the conductive layer 17 can be titanium, titanium nitride, tungsten, aluminum-silicon alloy or aluminum-silicon-copper alloy, etc. However, the instant disclosure is not limited to this.

Next, please refer to FIG. 2A to FIG. 2F, which are partial section views illustrating respectively the trenched power semiconductor element in each step of a manufacturing process thereof according to one embodiment of the instant disclosure.

Figure 2A:
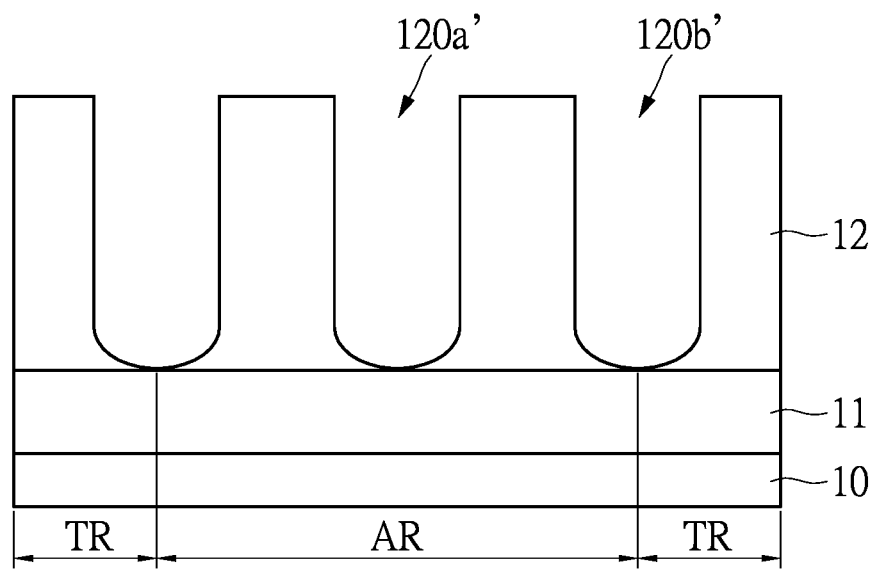
FIG. 2A to FIG. 2F are partial section views illustrating respectively the trenched power semiconductor element in each step of a manufacturing process thereof according to one embodiment of the instant disclosure.

As shown in FIG. 2A, a buffer layer 11 and an epitaxial layer 12 are formed above the substrate 10. An active region AR and a terminal region TR are defined in the epitaxial layer 12. In addition, a plurality of primary element trenches 120a' (one of which is shown in FIG. 2 for illustration) and a plurality of primary terminal trenches 120b' are formed inside the epitaxial layer 12. In one embodiment, these primary element trenches 120a' and primary terminal trenches 120b' have depths ranging from 2 μm to 6 μm.

Figure 2B:
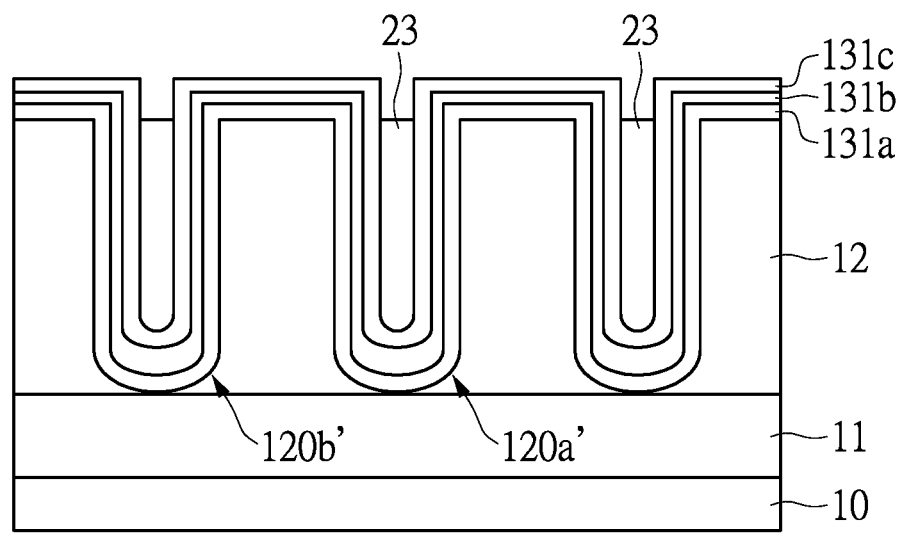

Please refer to FIG. 2B. A first primary material layer 131a, a second primary material layer 131b, and a third primary material layer 131c are formed in sequence from the inner wall surfaces of the primary element trench 120a' and the primary element trenches 120b', and polycrystalline silicon materials 23 are formed inside the primary element trench 120a' and the primary terminal trenches 120b'.

The material of the second primary material layer 131b is different from that of the first primary material layer 131a and that of the second primary material layer 131c, but the types of materials of the first primary material layer 131a and the third primary material layer 131c are not limited. More specifically, materials that allow the first and third primary material layers 131a, 131c to remain while the second primary material layer 131b is being etched away are qualified. For instance, the first and third primary material layers 131a, 131c can be silicon oxide layers, and the second primary material layer 131b can be a nitride layer, e.g. a silicon nitride layer.

On the other hand, the thickness of the first primary material layer 131a can be from 5 nm to 8 nm, the thickness of the second primary material layer 131b can be from 20 nm to 30 nm, and the thickness of the third primary material layer 131c can be from 60 nm to 120 nm.

The step of forming the polycrystalline silicon materials 23 in the primary element trench 120a' and the primary terminal trenches 120b' can be performed using any technical means. For example, the step can be completed by forming a polycrystalline silicon layer thoroughly on the epitaxial layer 12 such that the polycrystalline silicon material fills the trenches, and then etching back the polycrystalline silicon layer covering on the top surface of the epitaxial layer 12, leaving the rest of the polycrystalline silicon materials 23 inside the primary element trench 120a' and the primary terminal trenches 120b'. The polycrystalline silicon 23 can be a polycrystalline silicon structure including conductive impurities (doped poly-Si.)

Figure 2C:
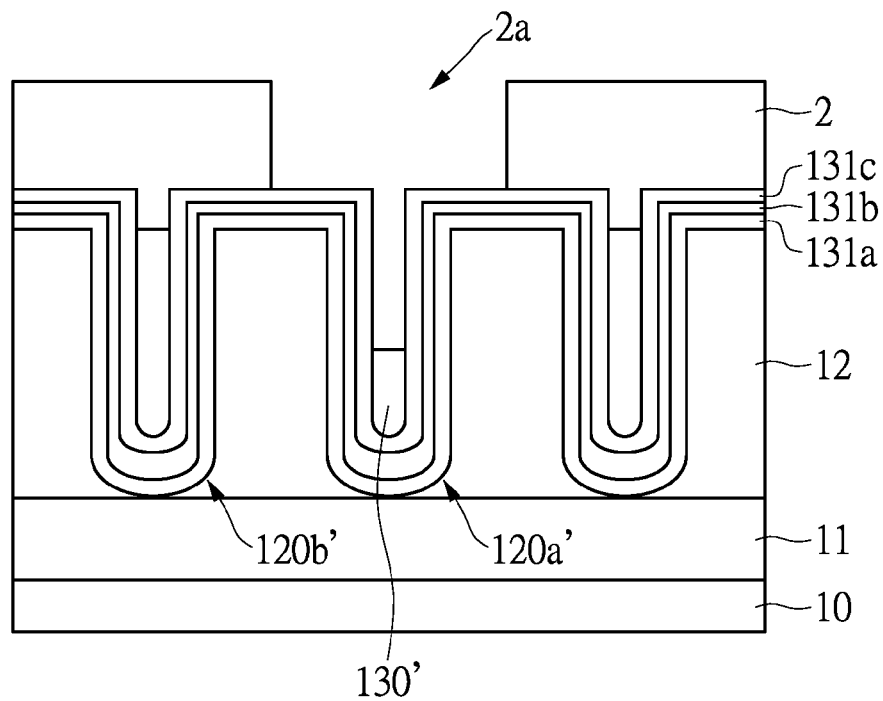

Next, please refer to FIG. 2C. A photoresist layer 2 is formed on the epitaxial layer 12, covering the terminal region TR so as to form a primary shielding electrode 130' inside the primary element trench 120a'. Specifically, the photoresist layer 2 has an opening 2a to expose the active region AR inside the primary element trench 120a' to the air. Furthermore, in the present embodiment, the photoresist layer 2 covers the primary terminal trenches 120b' located at the terminal region TR. Then, through an etching process, the polycrystalline silicon material 23 inside the primary element trench 120a' is etched to form the primary shielding electrode 130' situated at the bottom part of the primary element trench 120a'. After the etching process, the photoresist layer 2 is removed.

Figure 2D:
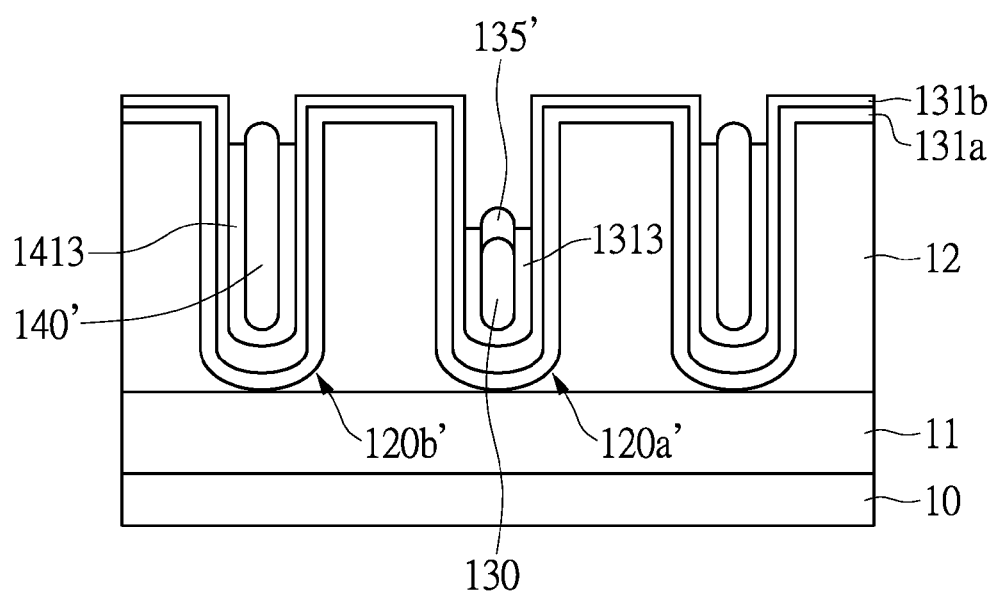

Please refer to FIG. 2D, in which a thermal oxidation manufacturing process is performed so as to form a shielding electrode 130 in the primary element trench 120a' and an oxide layer 135' on top of the shielding electrode 130. Specifically, during the thermal oxidation manufacturing process, a top portion of the primary shielding electrode 130' is oxidized to form the oxide layer 135'. Afterward, the third primary material layer 131c at the upper portion of the primary element trench 120a' is removed through an optional etching process.

It is noted that, when performing the optional etching process, the primary terminal electrode 140' inside the primary terminal trenches 120b' and the second primary material layer 131b can act as coverings protecting the third primary material layer 131c inside the primary terminal trench 120b' from being overly etched.

Figure 2E:
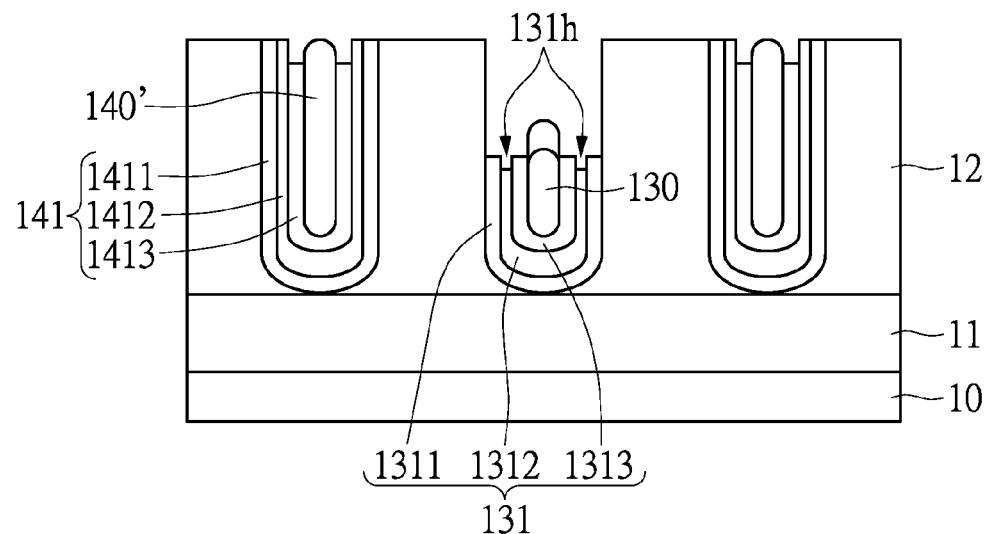

Please refer to FIG. 2E, in which a portion of the second primary material layer 131b and a portion of the first primary material layer 131a at the upper portion of the primary element trench 120a' are etched away so as to form the shielding dielectric layer 131 that includes the first material layer 1311, the second material layer 1312, and the third material layer 1313. It should be noted that at least one end surface of the second material layer 1312 is recessed relative to the end surfaces of the first material layer 1311 and the third material layer 1313 so that the shielding dielectric layer 131 includes at least one hole 131h at top thereof (two holes 131h are shown in FIG. 2E.)

Figure 2F:
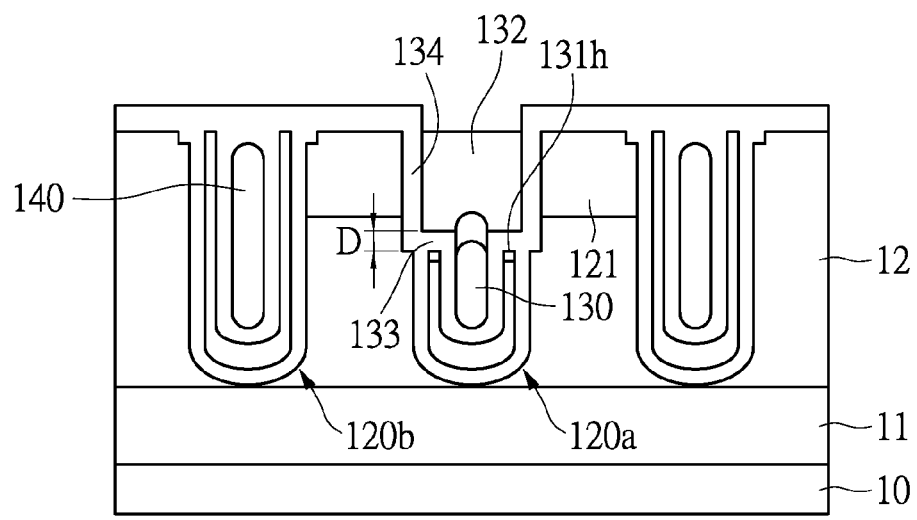

Please refer to FIG. 2F. Next, a thermal oxidation manufacturing process is performed so as to form the gate insulating layer 134 and the insulating separation layer 133 that seals the holes 131h. Specifically, the inner wall surface of the upper portion of the primary element trench will be oxidized for being exposed to the air. Therefore, after the gate insulating layer 134 is formed, the interface between the gate insulating layer 134 and the epitaxial layer 12 and the interface between the first material layer 1311 and the epitaxial layer 12 will be mutually offset so that they are at two different vertical reference planes. That is to say, after the gate insulating layer 134 is formed, the width of the upper portion of the element trench 120a will be larger than that of the lower portion thereof. The thickness of the gate insulating layer 134 can be from 25 nm to 60 nm.

It should be noted that, during the thermal oxidation manufacturing process, along with the increase of the thickness of the oxide layer, the insulating separation layer 133 sealing the holes 131h is formed above the second material layer 1312. Since the second material layer 1312 will not be further oxidized, the holes 131h will not be filled with the insulating separation layer 133. The insulating separation layer 133, the dielectric interlayer 135, and the gate insulating layer 134 jointly define a recess. Afterward, the recess is filled with polycrystalline silicon to form the gate electrode 132, and the gate electrode 132 is spaced apart from the holes 131*h* at a predetermined distance D through the insulating separation layer 133. In one embodiment, the aforementioned distance ranges from 50 nm to 70 nm.

After an electrical property test, although the holes 131*h* still exist in the element trench 120*a*, the holes 131*h* will not affect the electrical properties of the trenched power semiconductor element 1 because the holes 131*h* and the gate electrode 132 are separated from each other.

Next, the body region 121, the source region 122, and a redistribution layer is formed in sequence so as to form the trenched power semiconductor element 1 as shown in FIG. 1.

Specifically, a substrate doping process is performed on the epitaxial layer 12 to form a body region 121 in the active region AR, and a source doping process is performed to form a source region 122 in the active region AR, wherein the source region 122 is on top of the body region 121. The lower edge of the body region 121 is higher than the top surface of the second material layer 1312.

Next, the redistribution layer is formed on the epitaxial layer so that the source region 122, the gate electrode 132 and the shielding electrode 130 can be electrically connected to a control circuit at the outside of the trenched power semiconductor element 1. The redistribution layer includes the dielectric interlayer 15 having the plurality of contact windows, the conductive insertions 16, and the conductive layer 17 electrically connected to the conductive insertions 16. The formation of the dielectric interlayer 15, the conductive insertions 16 and conductive layer 17 can be completed by adopting any previously known technical means in the prior art. Also, with reference to the aforementioned description of the embodiments of the instant disclosure, a person skilled in the art should be able to deduce other details of embodiment, and thus the details will not be further described herein.

Figure 3:
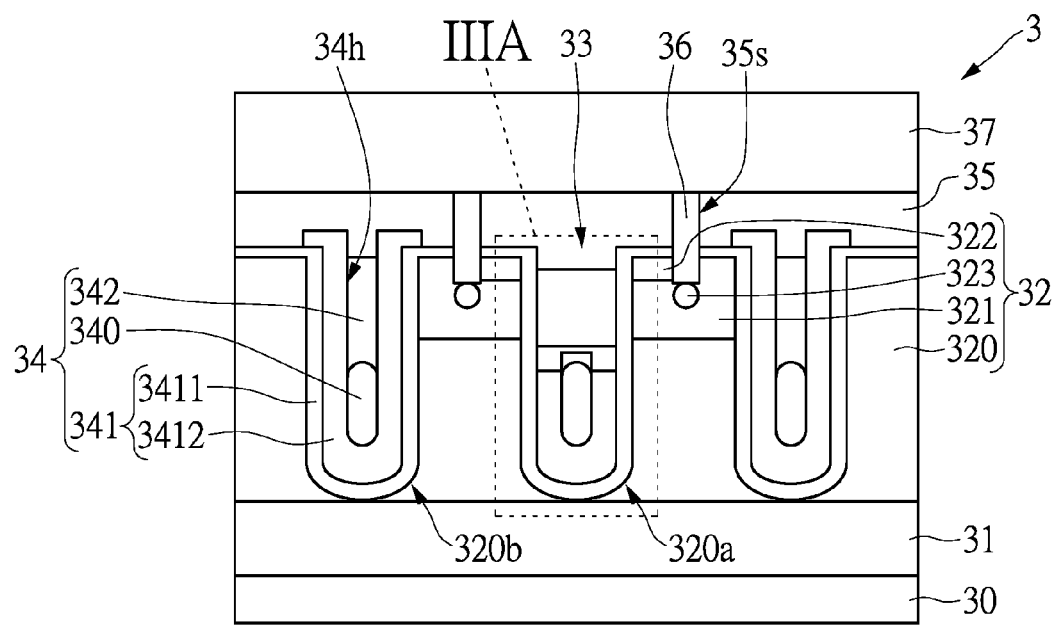
FIG. 3 is a partial section view illustrating a trenched power semiconductor element according to another embodiment of the instant disclosure.
Figure 3A:
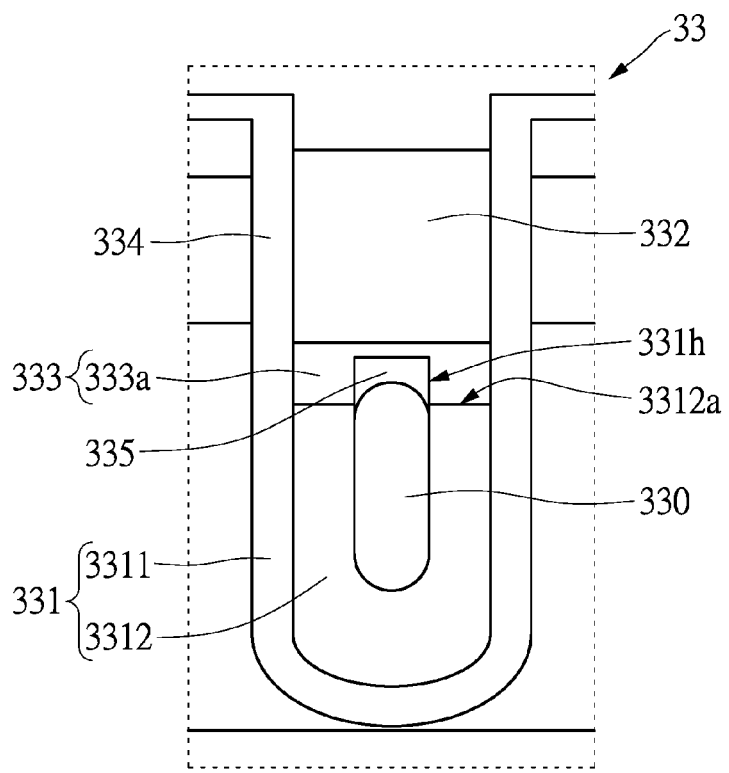
FIG. 3A is a partial enlarged view illustrating the trenched-gate structure marked IIIA in FIG. 3.

Please refer to FIG. 3 and FIG. 3A. The trenched power semiconductor element 3 according to the present embodiment has reference numbers similar to that of the trenched power semiconductor element 1 of FIG. 1. The parts of the present embodiment similar to the former embodiment will be omitted herein and will not be further described.

Please refer to FIG. 3A. In the present embodiment, the shielding dielectric layer 331 of the trenched-gate structure 33 has a first material layer 3311 and a second material layer 3312, wherein the second material layer 3312 directly contacts and encloses the two opposite wall surfaces and the bottom surface of the shielding electrode 330. The two opposite end surfaces 3312*a* of the second material layer 3312 are both lower than the top surface of the inter-electrode dielectric layer 335 so as to form the hole 331*h*. In one embodiment, the thickness of the first material layer 3311 is approximately from 25 nm to 60 nm, and the thickness of the second material layer 3312 is approximately from 50 nm to 200 nm.

The insulating separation layer 333 is located between the hole 331*h* and the gate electrode 332 and seals the hole 331*h*. In the present embodiment, the insulating separation layer 333 is a low-temperature oxide layer, and the insulating separation layer 333 includes at least one extension portion 333*a* that fills the hole 331*h* so as to seal the hole 331*h*. It should be noted that, in the present embodiment, since the formation of the insulating separation layer 333 using low temperature chemical vapor deposition is performed after the formation of the inter-electrode dielectric layer 335, part of the insulating separation layer 333 is located between the gate electrode 332 and the inter-electrode dielectric layer 335. The thickness of the insulating separation layer 333 is approximately 10 nm.

Please refer to FIG. 3. The terminal electrode 340 according to the present embodiment is at the lower half part of the terminal trench 320*b*. That is to say, the top end of the terminal electrode 340 and the top end of the shielding electrode 330 are at or nearly at the same horizontal plane.

The terminal dielectric layer 341 includes a first dielectric material layer 3411 and a second dielectric material layer 3412 disposed between the terminal electrode 340 and the first dielectric material layer 3411. The first dielectric material layer 3411 covers the inner wall surface of the terminal trench 320*b*, and the second dielectric material layer 3412 directly contacts and encloses the two opposite wall surfaces of the terminal electrode 340 and the bottom surface. Furthermore, the top end of the second dielectric material layer 3412 is higher than that of the terminal electrode 340, and more specifically, higher than the top end of the gate electrode 332. Therefore, the top ends of the second dielectric material layer 3412 and the terminal electrode 340 jointly define a first recess 34*h*.

In the present embodiment, the terminal electrode structure 34 further includes an insulation material 342 that fills the first recess 34*h*. The material of the insulation material 342 can be selected from a group consisting of boron-phosphorosilicate glass (BPSG), phosphorosilicate glass (PSG), oxide, nitride, or a combination thereof.

Please refer to FIG. 4A to FIG. 4E, which are partial section views illustrating the trenched power semiconductor element 3 of the former embodiment in each step of a manufacturing process thereof. Similar to the embodiment shown in FIG. 2A, the element trench 320*a* and the element trench 320*b* are formed in the epitaxial layer 32 and are situated at the active region AR and the terminal region TR respectively.

Figure 4A:
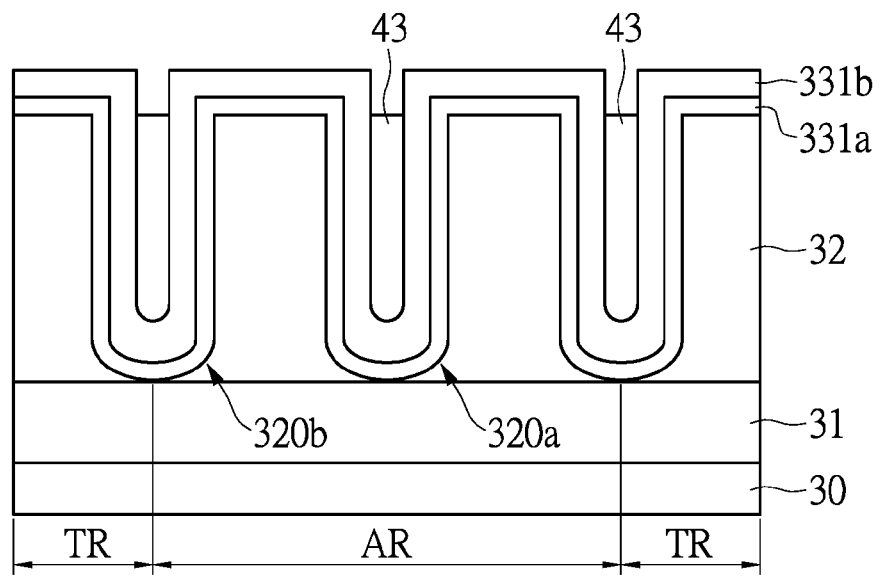
FIG. 4A to FIG. 4E are partial section views illustrating respectively the trenched power semiconductor element in each step of a manufacturing process thereof according to one embodiment of the instant disclosure.

Please refer to FIG. 4A first. The first primary material layer 331*a* and the second primary material layer 331*b* are formed in sequence on the inner wall surfaces of the element trench 320*a* and the terminal trench 320*b*. In addition, the polycrystalline silicon materials inside the element trench 320*a* and the terminal trench 320*b* are also formed.

Figure 4B:
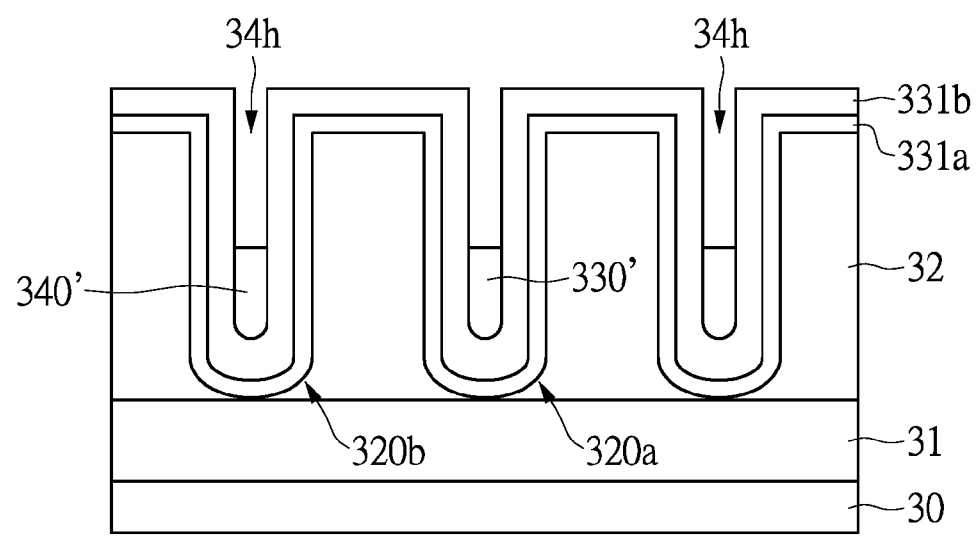

Please refer to FIG. 4B. Next, the polycrystalline silicon material 43 at the upper portions of the element trench 320*a* and the terminal trench 320*b* is removed so as to form a primary shielding electrode 330' and the primary terminal electrode 340' at the lower portions of the element trench 320*a* and the terminal trench 320*b*. In the terminal trench 320*b*, the top end of the terminal electrode 340 and the second primary material layer 331*b* define a first recess 34*h*.

Figure 4C:
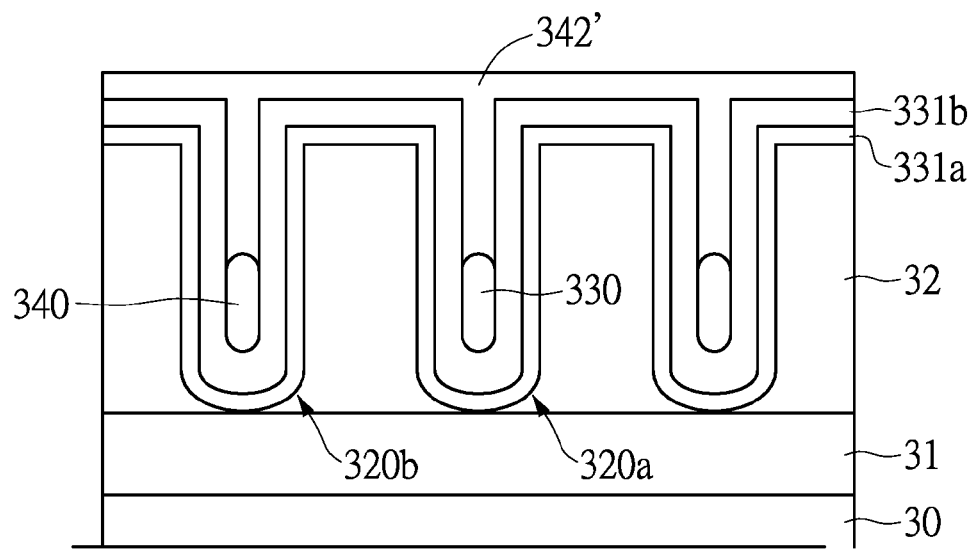

Please refer to FIG. 4C. A primary insulation material 342' fills the space remaining in the element trench 320*a* and the terminal trench 320*b* and covers the surface of the epitaxial layer 32. In one embodiment, the primary insulation material 342' can be formed through a physical vapor deposition process or a chemical vapor deposition process.

Figure 4D:
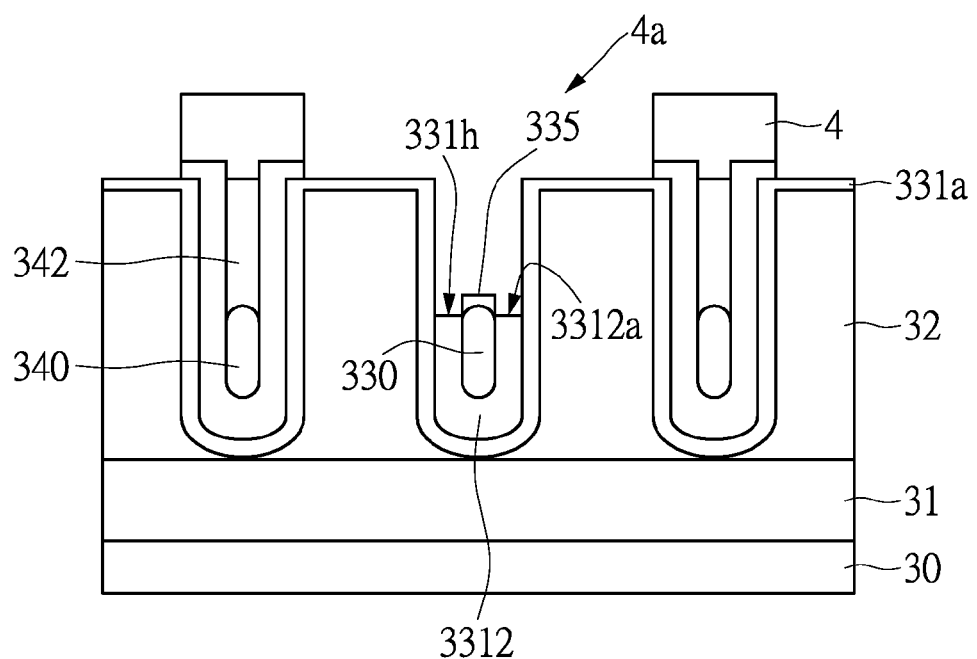

Please refer to FIG. 4D. Part of the primary insulation material 342' and the second primary material layer 331*b* are removed such that the inter-electrode dielectric layer 335 on top of the shielding electrode 330 and the second material layer 3312 at the lower portion of the element trench 320*a* are formed.

Specifically, first of all, a photoresist layer 4 is formed on the terminal trench 320*b*, wherein the photoresist layer 4 has at least one opening 4*a* to expose the surfaces of the element trench 320*a* and the epitaxial layer 32 at the active region AR to the air. Afterward, part of the primary insulation material 342' and part of the second primary material layer 331b are removed through an optional etching process such that the inter-electrode dielectric layer 335 and the second material layer 3312 are formed. As shown in FIG. 4D, the end surface 3312a of the second material layer 3312 is lower than the top end of the inter-electrode dielectric layer 335 to form the hole 331h. In one embodiment, the thickness of the inter-electrode dielectric layer 335 ranges from 150 nm to 220 nm approximately.

Figure 4E:
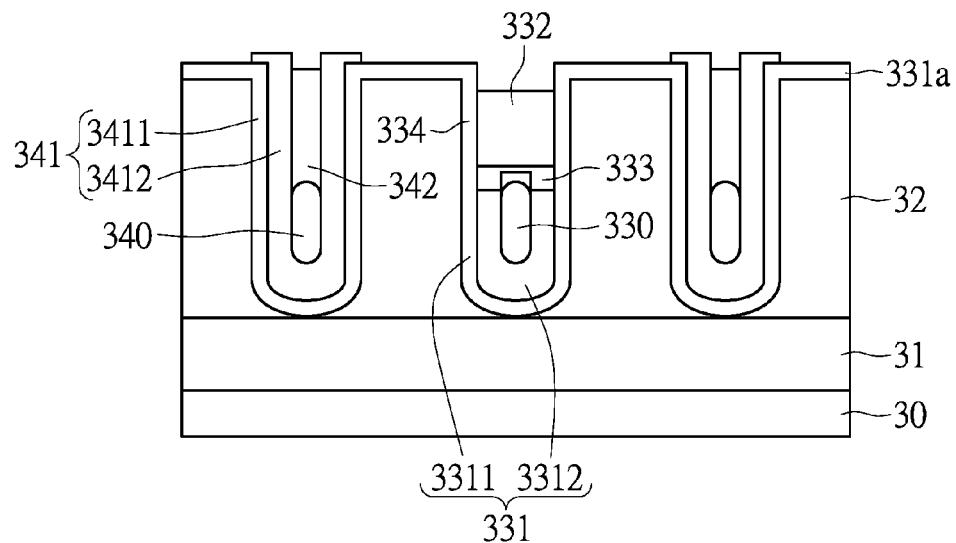

Please refer to FIG. 4E. Next, after the removal of the photoresist layer 4, the insulating separation layer 333 is formed so as to seal the hole 331h, wherein the insulating separation layer 333 covers the inter-electrode dielectric layer 335 and has at least one extension portion that fills the hole 331h.

In the present embodiment, the insulating separation layer 333 is a low temperature oxide layer. That is to say, through a low temperature chemical vapor deposition process, the insulating separation layer 333 filling the hole 331h and covering the inter-electrode dielectric layer 335 is formed. It is noted that low temperature oxide layers have higher fillability than high temperature oxide layers, and thus the hole 331h can be filled. Afterward, the gate electrode 332 is formed in the element trench 320a. In one embodiment, the thickness of the insulating separation layer 333 is from 8 nm to 15 nm approximately.

In addition, the first primary material layer 331a is not removed during the manufacturing process, and thus the first primary material layer 331a covering the inner wall surface of the upper portion of the element trench 320a can be the gate insulating layer 334, and the first primary material layer 331a covering the lower portion of the element trench 320a can be a part of the shielding dielectric layer 331, i.e. the first material layer 3311. Furthermore, after the formation of the hole 331h, the hole 331h will be separated from the side wall surface of the element trench 320a.

Next, the body region 321, the source region 322, and the redistribution layer are formed so as to form the trenched power semiconductor element 3 of FIG. 3. The detailed steps of forming the body region 321, the source region 322, and the redistribution layer have been described in above, and thus will not be further explained herein.

Figure 5:
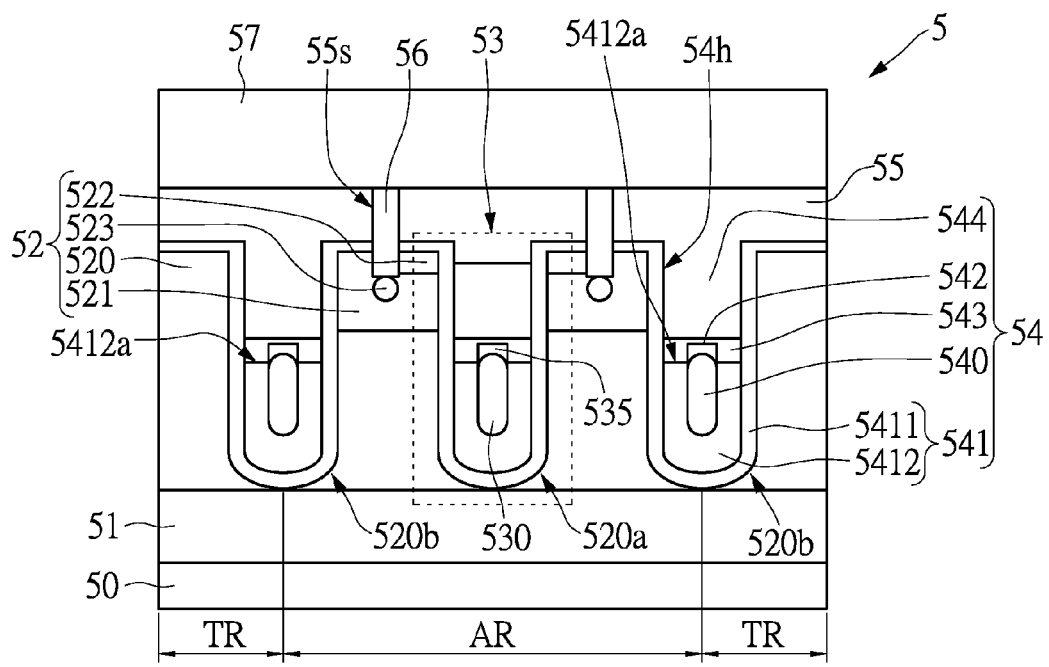
FIG. 5 is a partial section view illustrating a trenched power semiconductor element according to another embodiment of the instant disclosure.

Please refer to FIG. 5, which is a partial section view illustrating a trenched power semiconductor element according to another embodiment of the instant disclosure. The trenched power semiconductor element 5 has the same reference numbers as the trenched power semiconductor element 3 of FIG. 3, and the identical components of these two trenched power semiconductor elements will not be further explained herein.

The trenched-gate structure 53 of the trenched power semiconductor element 5 is identical to the trenched-gate structure 33 of FIG. 3A, but terminal electrode structure 54 is similar to the trenched-gate structure 53. However, the terminal electrode structure 54 of the present embodiment does not include conductive materials at the upper portion of the terminal trench 520b.

Specifically, the terminal electrode structure 54 includes a terminal electrode 540, a terminal dielectric layer 541 enclosing the terminal electrode 540, a first separation layer 542, a second separation layer 543, and an insulation material 544.

The terminal electrode 540 is located at the lower portion of the terminal trench 520b, and the top ends of the terminal electrode 540 and the shielding electrode 530 are approximately at or nearly at the same horizontal plane. The first separation layer 542 on top of the terminal electrode 540 is similar to an inter-electrode layer 535 of the trenched-gate structure 53.

The terminal dielectric layer 541 surrounds the terminal electrode 540, and includes a first dielectric material layer 5411, and a second dielectric material layer 5412 disposed between the first dielectric material layer 5411 and the terminal electrode 540. The end surface 5412a of the second dielectric material layer 5412 is recessed relative to the first separation layer 542 to form a recess region, which is not shown is the figure, wherein the structure mentioned herein is similar to that of the trenched-gate structure 53.

The first dielectric material layer 5411 and the second separation layer 543 define a second recess 54h in the terminal trench 520b, the insulation material 544 fills the second recess 54h. In the present embodiment, the insulation material 544 is selected from the group consisting of boron-phosphorosilicate glass (BPSG), phosphorosilicate glass (PSG), oxide, nitride, or a combination thereof.

Please refer to FIG. 6A to FIG. 6F, which are partial section views illustrating respectively the trenched power semiconductor element in each step of a manufacturing process thereof according to one embodiment of the instant disclosure. Please refer to FIG. 4A to FIG. 4C for corresponding description of the steps completed before FIG. 6A, which will not be further explained herein.

Figure 6A:
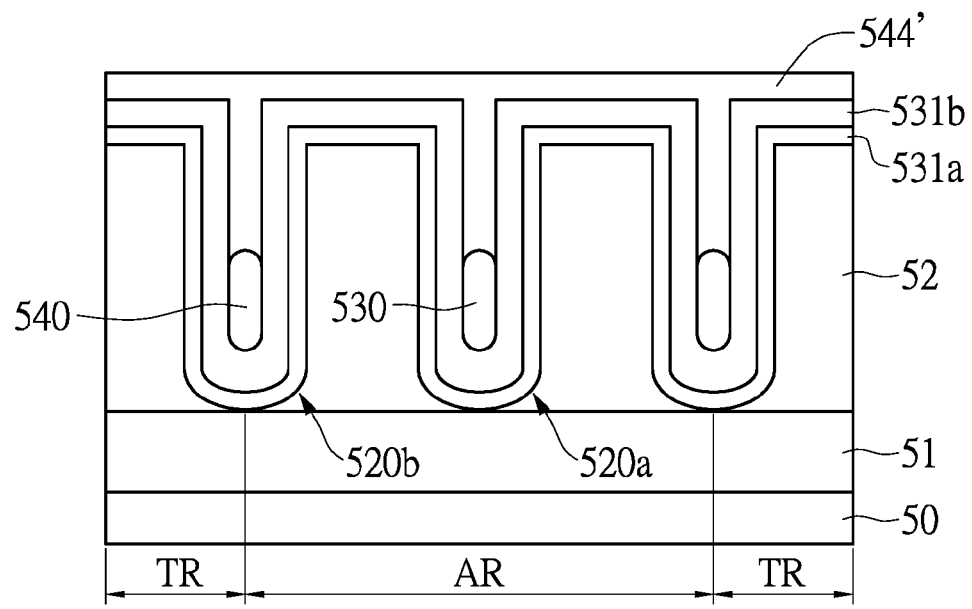
FIG. 6A to FIG. 6F are partial section views illustrating respectively the trenched power semiconductor element in each step of a manufacturing process thereof according to one embodiment of the instant disclosure.

In FIG. 6A, a first primary material layer 531a and a second primary material layer 531b are formed in sequence on the inner wall surfaces of the element trench 520a and the terminal trench 520b. Moreover, the shielding electrode 530 and the terminal electrode 540 are formed respectively at the lower portions of the element trench 520a and the terminal trench 520b. Furthermore, the remaining space of the element trench 520a and the terminal trench 520b is filled with a primary insulation material 544', which further covers the surface of the epitaxial layer 52.

Figure 6B:
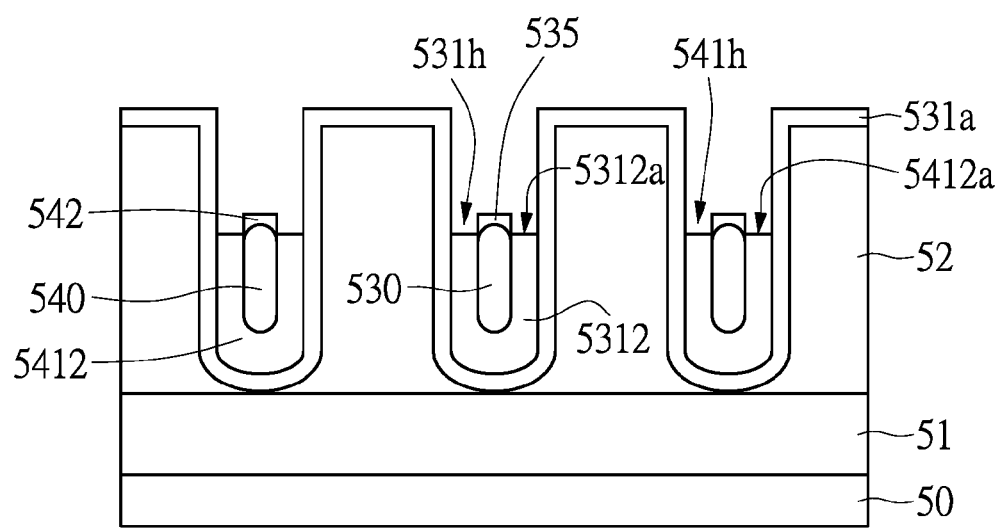

Please refer to FIG. 6B, in which part of the primary insulation material 544' is removed so as to separately form the inter-electrode layer 535 covering the shielding electrode 530 and the first separation layer 542 covering the terminal electrode 540. Afterward, part of the second primary material layer 531b is removed to separately form a second material layer 5312 at the lower portion of the element trench 520a and the second dielectric material layer 5412 at the lower portion of the terminal trench 520b. The difference between this step of the present embodiment and the corresponding step in FIG. 4D is that a photoresist layer is not used.

In addition, the end surface 5312a of the second material layer 5312 is lower than the top surface of the inter-electrode dielectric layer 535 so as to form the hole 531h. Similarly, the end surface 5412a of the second dielectric material layer 5412 is lower than the top end of the first separation layer 542 so as to form the recess region 541h.

Figure 6C:
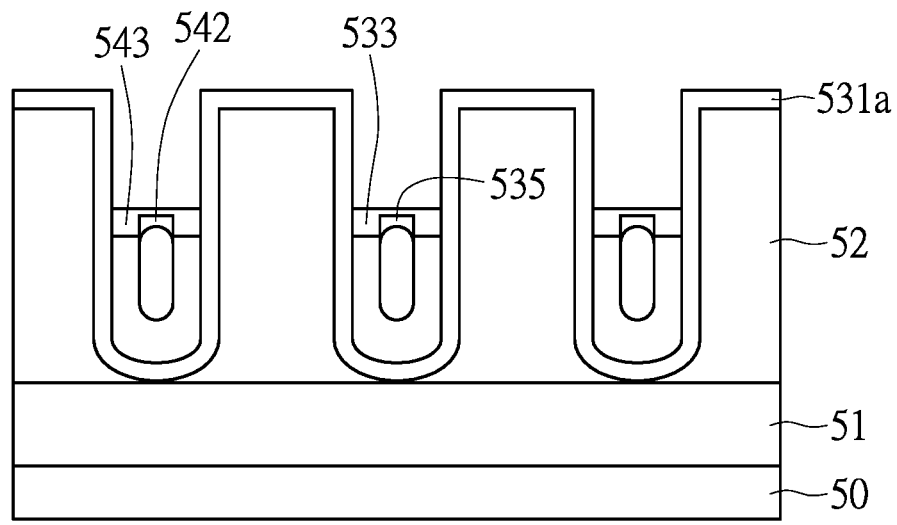
Figure 6D:
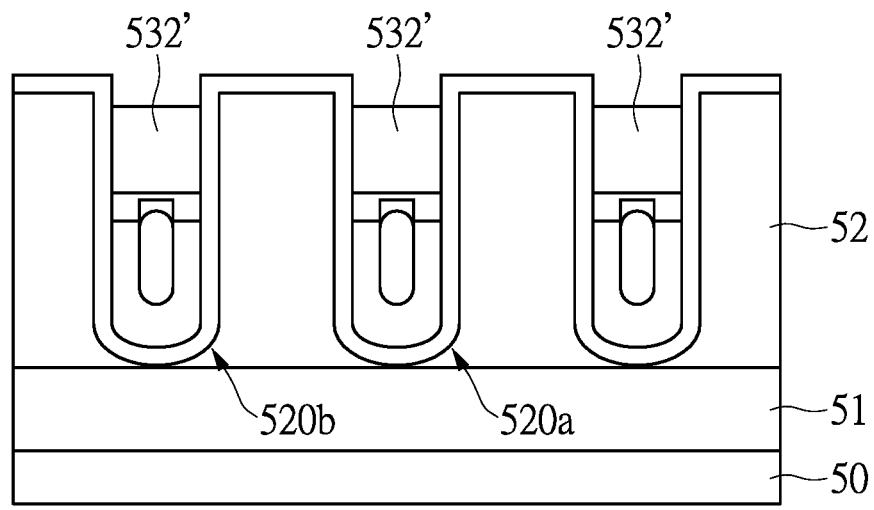

Please refer to FIG. 6C. The insulating separation layer 533 and the second separation layer 543 are formed so as to seal the hole 531h and the recess region 541h respectively. Furthermore, the insulating separation layer 533 covers the inter-electrode dielectric layer 535 and has at least one extension portion filling the hole 531h. Similarly, the recess region 541h is also filled with the second separation layer 543, which covers the first separation layer 542.

In the present embodiment, both the insulating separation layer 533 and the second separation layer 543 are low-temperature oxide layers. That is to say, both of the insulating separation layer 533 and the second separation layer 543 are formed through low-temperature chemical vapor deposition processes. However, the preparation methods of the insulating separation layer 533 and the second separation layer 543 are not limited to this.

Please refer to 6D. The element trench 520a and each terminal trench 520b are filled with the conductive material 532'. Please refer to FIG. 6E. The conductive material 532' in each terminal trench 520b is removed, and the conductive material in the element trench 520a is left staying in the element trench 520a to form a gate electrode 532 in the element trench 520a.

Figure 6E:
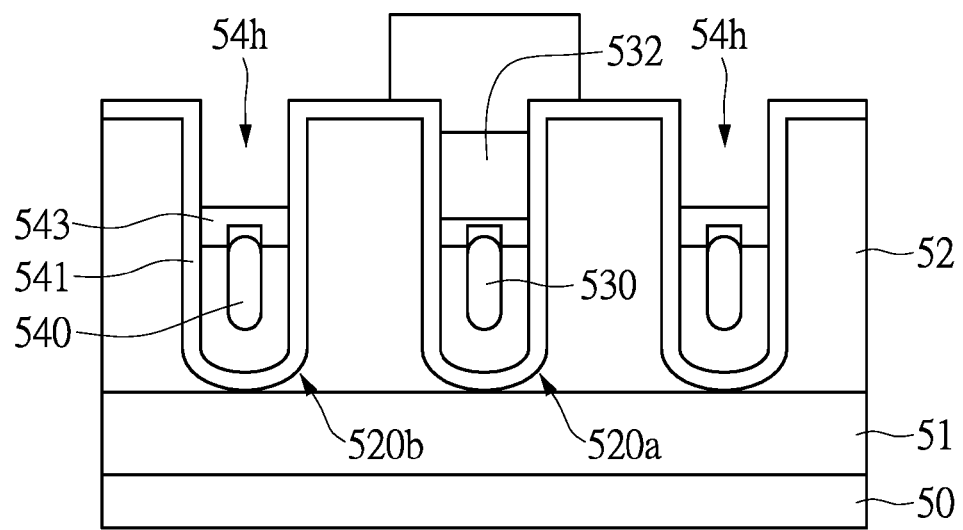

On the other hand, the conductive material 532' in each terminal trench 520b is removed so as to form a second recess 54h. As shown in FIG. 6E, the first dielectric material layer 5411 and the second separation layer 543 jointly define the second recess 54h.

Figure 6F:
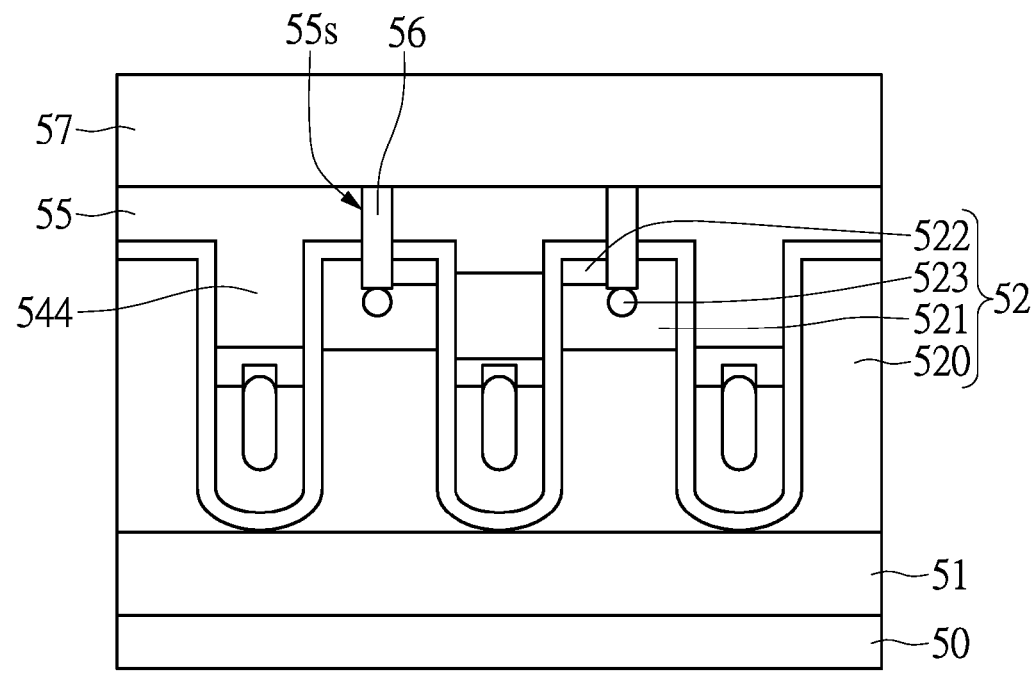

At last, please refer to FIG. 6F. A body region 521, a source region 522, and a redistribution layer are formed in sequence so as to form the trenched power semiconductor element 5 as shown in FIG. 5. In one embodiment of the instant disclosure, the second recess 54h can be filled during one of the steps of forming the redistribution layer, such as a step of forming a dielectric inter-layer 55, so as to form the insulation material 544 in the second recess 54h. The detailed steps of forming the body region 521, the source region 522, and the redistribution layer have already been described above and thus will not be further described herein.

Figure 7:
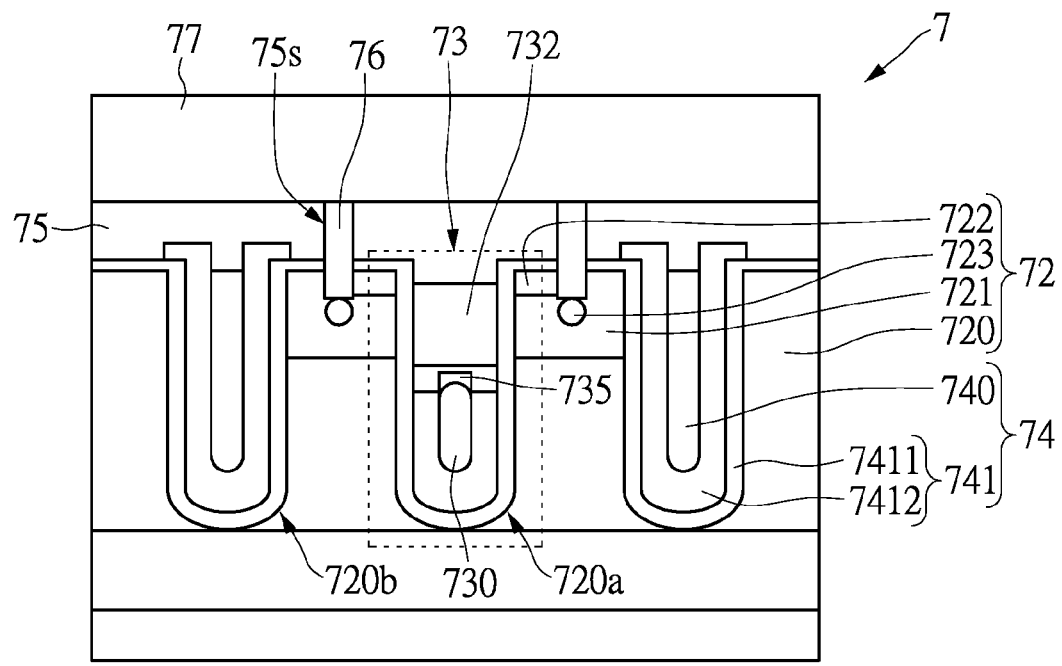
FIG. 7 is a partial section view illustrating a trenched power semiconductor element according to another embodiment of the instant disclosure.

Please refer to FIG. 7, which shows a partial section view illustrating a trenched power semiconductor element according to another embodiment of the instant disclosure. The trenched power semiconductor element 7 has the same reference numbers as the trenched power semiconductor element 5 of FIG. 5, and the identical components of these two trenched power semiconductor elements will not be further explained herein.

The trenched-gate structure 73 of the trenched power semiconductor element 7 is identical to the trenched-gate structure 53 of FIG. 5, but the trenched power semiconductor element 7 has another type of terminal electrode structure 74. The terminal electrode 740 of the present embodiment extends from the upper portion of the terminal trench 720b to the lower portion thereof, and the top end of the terminal electrode 740 is lower than that of the second dielectric material layer 7412.

Please refer to FIG. 8A to FIG. 8E, which show partial section views illustrating respectively the trenched power semiconductor element in each step of a manufacturing process thereof according to one embodiment of the instant disclosure.

Figure 8A:
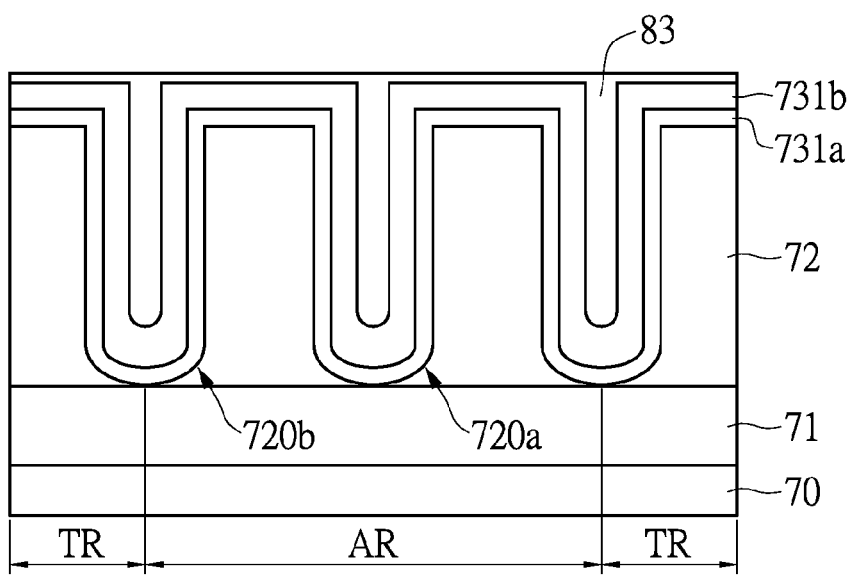
FIG. 8A to FIG. 8E are partial section views illustrating respectively the trenched power semiconductor element in each step of a manufacturing process thereof according to one embodiment of the instant disclosure.

As shown in FIG. 8A, a first primary material layer 731a and the second primary material layer 731b are formed in sequence on the inner wall surfaces of the element trench 720a and the terminal trench 720b. Moreover, a polycrystalline silicon material 83 is formed in the element trench 720a and the terminal trench 720b respectively.

Figure 8B:
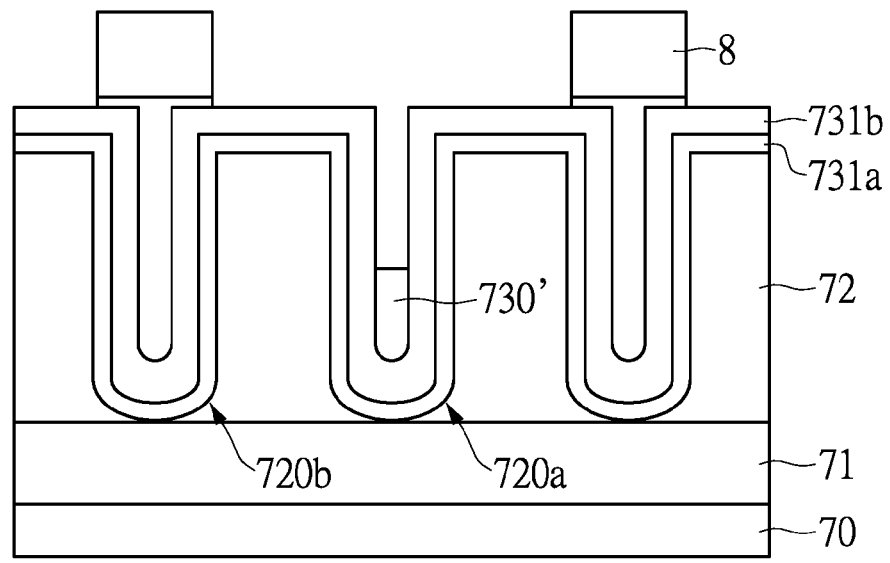

Next, please refer to FIG. 8B. The polycrystalline silicon material 83 at the upper portion of the element trench 720a is removed so as to form a primary shielding electrode 730'. Specifically, a photoresist layer 8 covering the terminal trench 720b is formed and then the polycrystalline silicon material 83 exposed to the air is etched away. Therefore, the part of the polycrystalline silicon material 83 on the surface of the epitaxial layer 72 and not covered by the photoresist layer 8 will be removed as well.

Figure 8C:
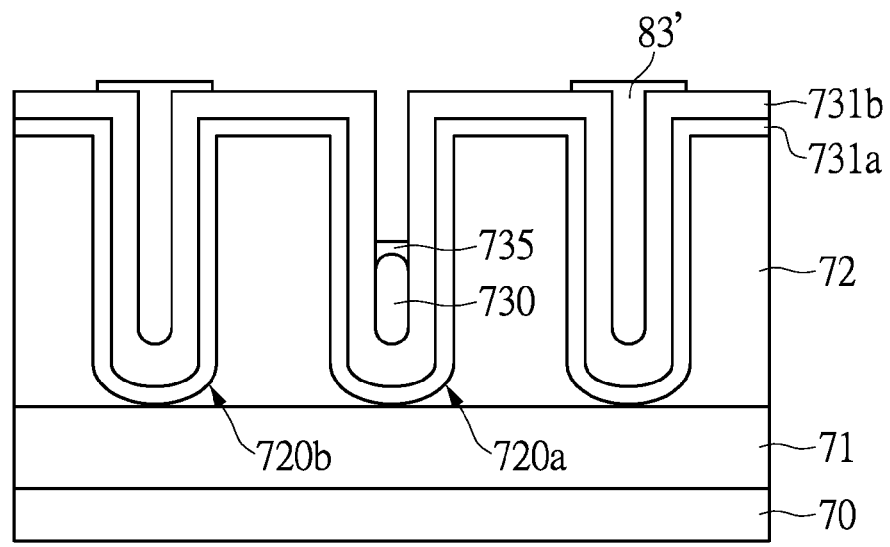

Please refer to FIG. 8C. Next, an inter-electrode dielectric layer 735 is formed on the shielding electrode 730. The thickness of the inter-electrode dielectric layer 735 is approximately 200 nm. The method of forming the inter-electrode dielectric layer 735 can be a prior art physical vapor deposition process or prior art chemical vapor deposition process. The instant disclosure does not limit the way of forming the inter-electrode dielectric layer 735. In one embodiment, the inter-electrode dielectric layer 735 can be formed utilizing a thermal oxidation process, in which the primary shielding electrode 730' is oxidized to form the inter-electrode dielectric layer 735.

Figure 8D:
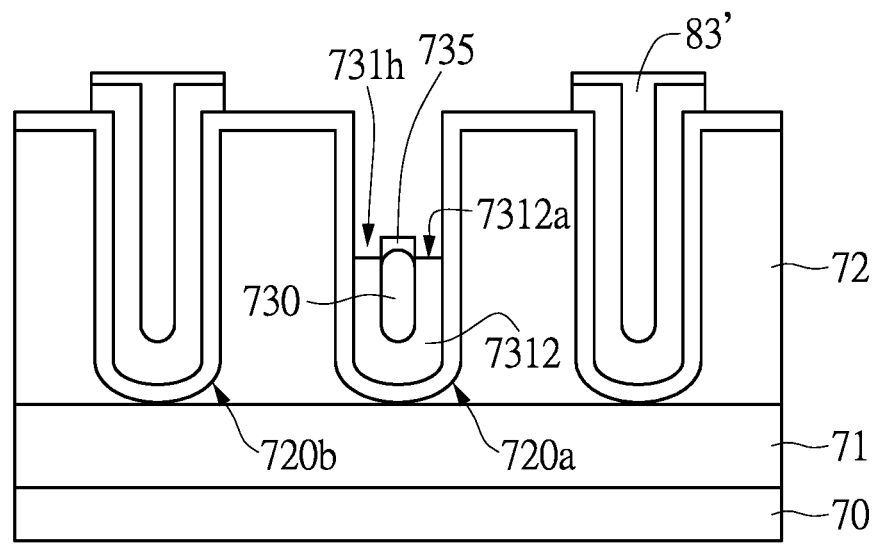

Please refer to FIG. 8D, in which part of the second primary material layer 731b is removed to form the second material layer 7312 at the lower portion of the element trench 720a. In this step, the polycrystalline silicon material 83' can act as a covering that covers the terminal trench 720b before the etching is performed. The end surface 7312a of the second material layer 7312 is lower than the top surface of the inter-electrode dielectric layer 735 so as to form the hole 731h.

Figure 8E:
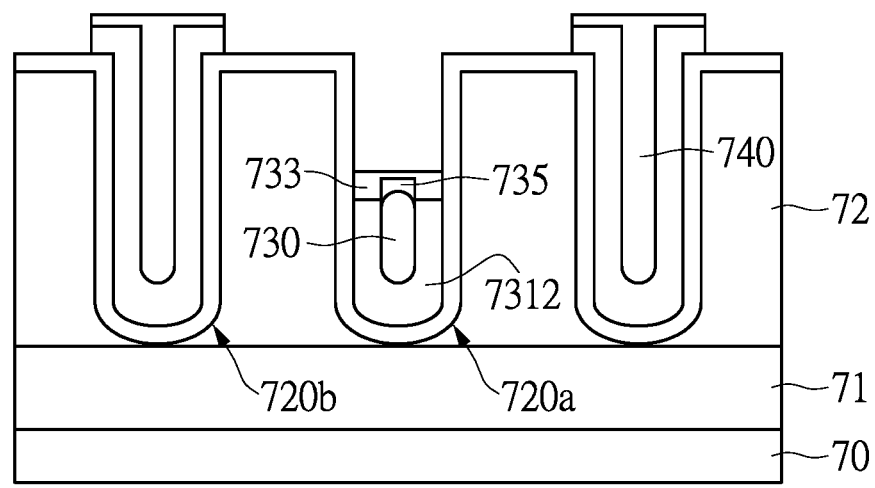

Please refer to FIG. 8E. An insulating separation layer 733 sealing the hole 731h and covering the inter-electrode dielectric layer 735 is formed. In the present embodiment, the insulating separation layer 733 is a low-temperature oxide layer, and has at least one extension portion filling the hole 731h so as to seal the hole 731h.

Please further refer to FIG. 7. At last, a gate electrode 732, a body region 721, and a redistribution layer are formed in sequence to form the trenched power semiconductor element 7 as shown in FIG. 7.

Moreover, the trenched-gate structures 13, 33, 53, 73 and the terminal electrode structures 14, 34, 54, 74 shown in FIG. 1, FIG. 3, FIG. 5, and FIG. 7 can be applied to trenched power semiconductor elements having Schottky diodes. Please refer to FIG. 9 to FIG. 12, which show partial section views of different types of trenched power semiconductor elements.

In the trenched power semiconductor elements 1', 3', 5', 7', body regions and source regions are not formed in the epitaxial layers 12, 32, 52, 72. In addition, the trenched power semiconductor elements 1', 3', 5', 7' respectively include a dielectric interlayer 15', 35', 55', 75', a conductive column 16', 36', 56', 76', and a contacting layer 17', 37', 57', 77'.

Figure 9:
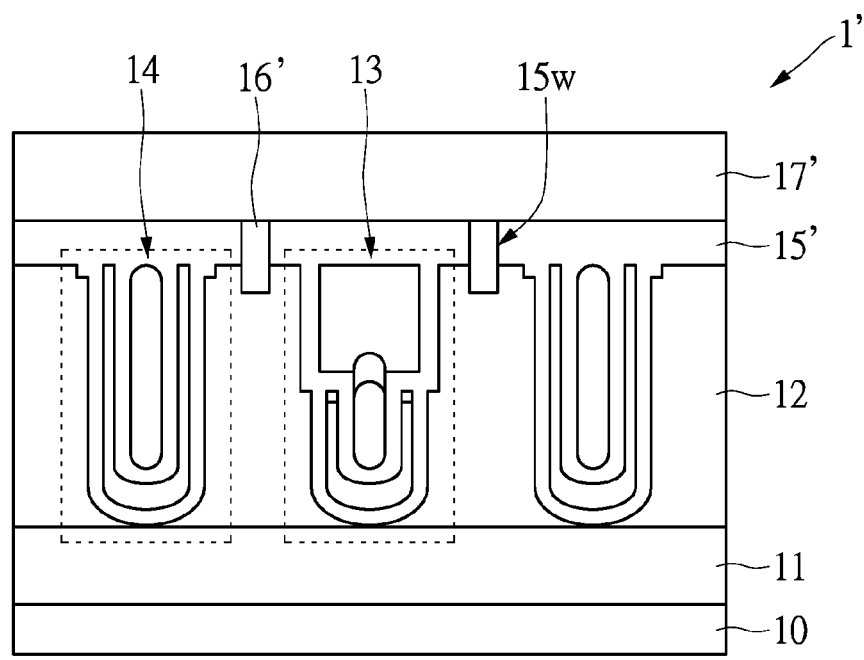
FIG. 9 is a partial section view illustrating a trenched power semiconductor element according to another embodiment of the instant disclosure.
Figure 10:
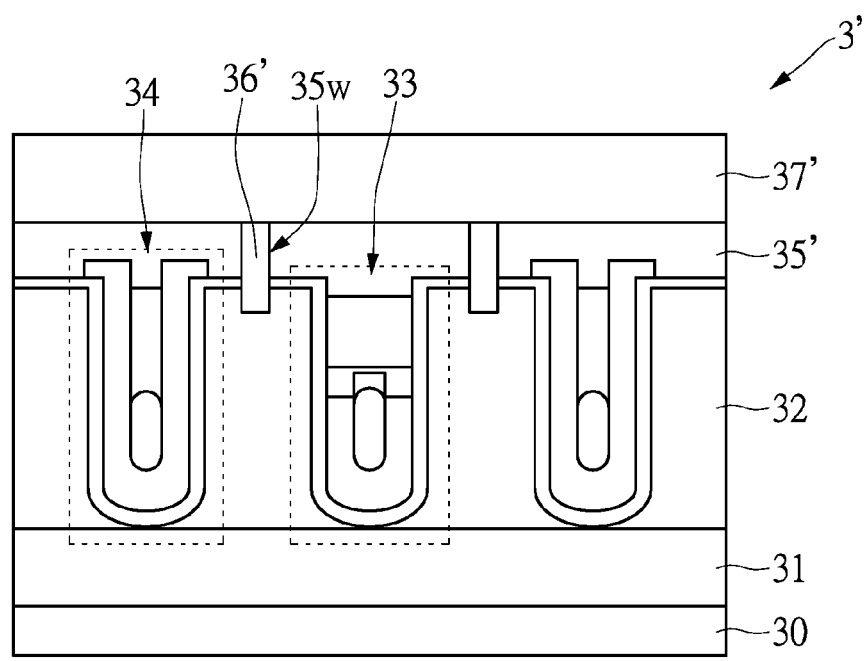
FIG. 10 is a partial section view illustrating a trenched power semiconductor element according to another embodiment of the instant disclosure.
Figure 11:
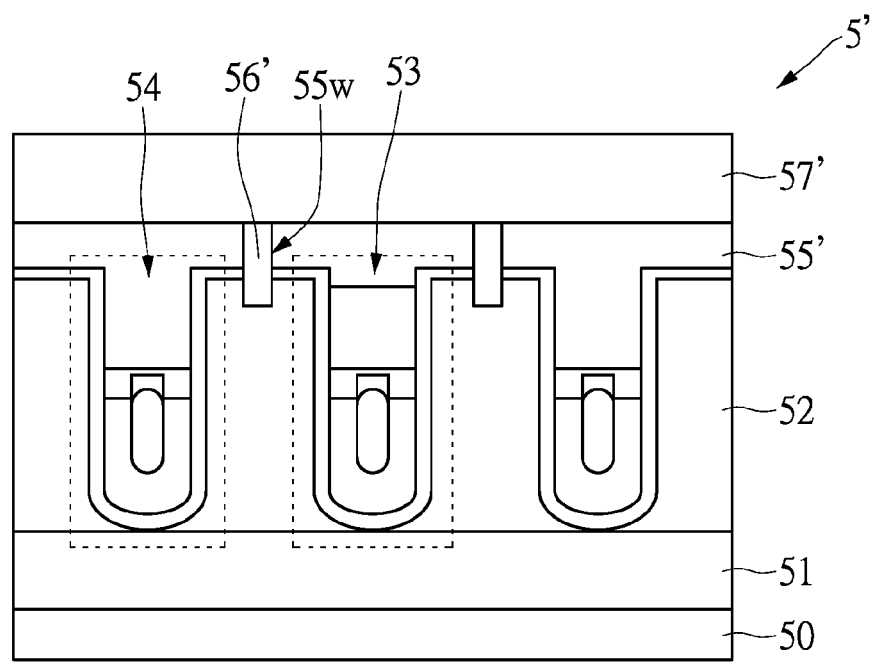
FIG. 11 is a partial section view illustrating a trenched power semiconductor element according to another embodiment of the instant disclosure.
Figure 12:
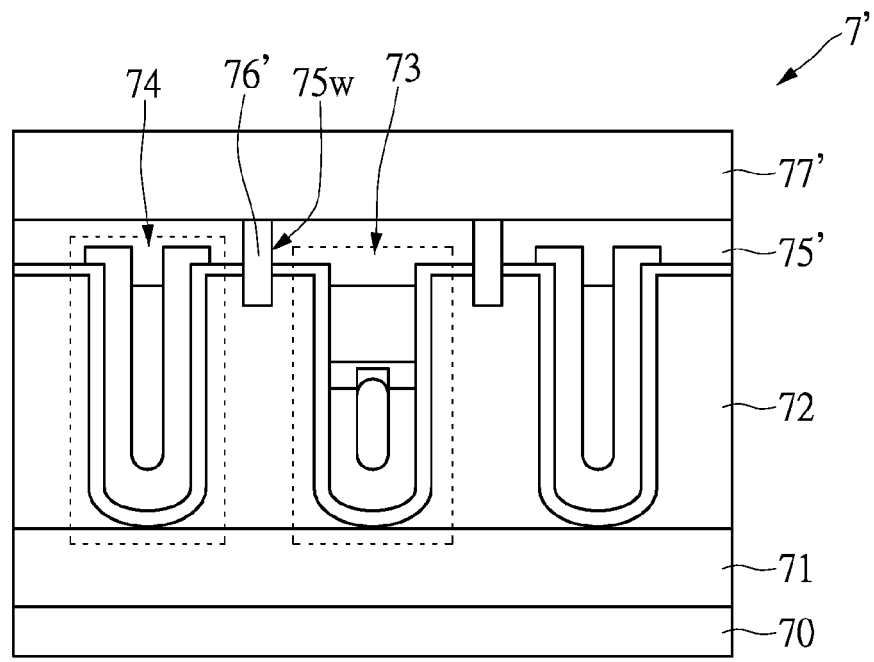
FIG. 12 is a partial section view illustrating a trenched power semiconductor element according to another embodiment of the instant disclosure.

Please refer to FIG. 9. The conductive layer 17' is electrically connected to the epitaxial layer 12 through the conductive column 16'. Specifically, the dielectric interlayer 15' includes at least one Schottky contact window 15w. In FIG. 9, a plurality of Schottky contact windows are illustrated. The conductive column 16' is disposed passing through the dielectric interlayer 15' through the Schottky contact windows 15w and extend toward the inside of the epitaxial layer 12, and is electrically connected to the epitaxial layer 12 between the element trenches 120a. Therefore, the trenched-gate structures 13, 33, 53, 73 and the terminal electrode structures 14, 34, 54, 76 are not exclusively applied to power transistors.

Moreover, the trenched-gate structures 13, 33, 53, 73 and the terminal electrode structures 14, 34, 54, 74 can be combined according to actual needs. The way of combining the trenched-gate structures 13, 33, 53, 73 and the terminal electrode structures 14, 34, 54, 74 is not limited to the embodiments provided by the instant disclosure.

In summary, in the trenched power semiconductor element according to the embodiments of the instant disclosure and the manufacturing process thereof, since the materials of the first material layer and the second material layer of the shielding dielectric layer are different, an end surface of the second material layer can be recessed relative to the first material layer through an optional etching process so as to make the holes stay farther from the gate electrodes. Furthermore, an insulating separation layer can be further formed to separate the holes from the gate electrodes and to thus prevent the holes existing in the trenched-gate structures from affecting the electrical properties of the trenched power semiconductor element. The way by which the insulating separation layer seals the holes can be sealing the openings of the holes or filling the holes.

Therefore, even if there exist holes in the trenched-gate structure, the occurrence of leakage currents between the gate electrode and the source can be prevented as long as the holes are separated from the gate electrode when the trenched power semiconductor element is in operation, whereby the trenched power semiconductor element can exhibit expected electrical properties.

The descriptions illustrated supra set forth simply the preferred embodiments of the instant disclosure; however, the characteristics of the present invention are by no means restricted thereto. All changes, alterations, or modifications conveniently considered by those skilled in the art are deemed to be encompassed within the scope of the instant disclosure delineated by the following claims.

What is claimed is:

1. A trenched power semiconductor element, comprising:
   a substrate;
   an epitaxial layer, situated on the substrate, wherein the epitaxial layer has at least one element trench formed therein; and
   a trenched-gate structure, situated in the at least one element trench, wherein the trenched-gate structure includes:
   a shielding electrode, disposed at a bottom part of the at least one element trench;
   a shielding dielectric layer, disposed at a lower portion of the element trench and surrounding the shielding electrode so as to separate the shielding electrode from the epitaxial layer, wherein the shielding dielectric layer has at least one hole;
   a gate electrode, disposed on the shielding electrode and electronically insulated from the shielding electrode;
   an insulating separation layer, disposed between the shielding dielectric layer and the gate electrode to seal the at least one hole and to space the gate electrode apart from the at least one hole at a predetermined distance; and
   a gate insulating layer, situated at an upper portion of the element trench and surrounding the gate electrode so as to separate the gate electrode from the epitaxial layer.

2. The trenched power semiconductor element according to claim 1, wherein the insulating separation layer seals an opening of the at least one hole, and the predetermined distance ranges from 50 nm to 70 nm, and the predetermined distance is the shortest distance between the gate electrode and the at least one hole.

3. The trenched power semiconductor element according to claim 1, wherein the shielding dielectric layer includes a first material layer and a second material layer disposed between the first material layer and the shielding electrode, and the at least one hole is formed by being recessed from an end surface of the second material layer, and an opening of the at least hole faces the gate electrode.

4. The trenched power semiconductor element according to claim 3, wherein the second material layer directly contacts and encloses two opposite wall surfaces and a bottom surface of the shielding electrode.

5. The trenched power semiconductor element according to claim 3, wherein the shielding dielectric layer further includes a third material layer disposed between the second material layer and the shielding electrode, the end surface of the second material layer being lower than an end surface of the third material layer.

6. The trenched power semiconductor element according to claim 1, wherein the insulating separation layer is a low temperature oxide layer, and the insulating separation layer has an extension portion filling the hole so as to seal the at least one hole.

7. The trenched power semiconductor element according to claim 1, wherein the gate insulating layer and the insulating separation layer are both thermal oxide layers, and a width of the upper portion of the element trench is larger than a width of the lower portion of the element trench.

8. The trenched power semiconductor element according to claim 1, further comprising an inter-electrode dielectric layer disposed between the gate electrode and the shielding electrode in such a manner that the gate electrode and the shielding electrode are electrically insulated with each other.

9. The trenched power semiconductor element according to claim 1, wherein the epitaxial layer further includes a terminal trench, and the trenched power semiconductor element further comprises a terminal electrode structure formed in the terminal trench, the terminal electrode structure including:
   a terminal electrode, situated in the terminal trench; and
   a terminal dielectric layer, disposed at an inner wall surface, the terminal dielectric layer having a shape that matches the inner surface of the terminal trench so as to separate the terminal electrode from the epitaxial layer, wherein the terminal dielectric layer includes a first dielectric material layer and a second dielectric material layer disposed between the first dielectric material layer and the terminal electrode.

10. The trenched power semiconductor element according to claim 9, wherein the terminal electrode extends from an upper portion of the terminal trench to the lower portion of the terminal trench, an upper end of the terminal electrode being lower than or having the same height with a side surface of the second dielectric material layer.

11. The trenched power semiconductor element according to claim 9, wherein the upper end of the terminal electrode is lower than a top surface of the shielding dielectric layer, the terminal trench defining a first recess, and the terminal electrode structure further including an insulation material filling the first recess.

12. The trenched power semiconductor element according to claim 9, wherein the upper end of the terminal electrode and the top surface of the shielding electrode are approximately at or nearly at the same horizontal plane, the terminal electrode structure further comprising:
   a first separation layer, covering the upper end of the terminal electrode, wherein an end surface of the second dielectric material layer is recessed relative to a top surface of the first separation layer so as to form at least one recess area;
   a second separation layer, sealing the recess area and covering the first separation layer, wherein a second groove is defined between the first dielectric material layer and the second separation layer; and
   an insulation material filling the second groove.

13. The trenched power semiconductor element according to claim 1, further comprising:

a dielectric interlayer, situated at a surface of the epitaxial layer and covering the element trench, wherein the dielectric interlayer has at least one Schottky contact window; and a conductive insertion passing through the dielectric interlayer, the conductive insertion electrically contacts the epitaxial layer through the Schottky contact window to form a Shcottky diode.

14. The trenched power semiconductor element according to claim 1, further comprising a body region formed in the epitaxial layer and a source region formed on top of the body region, wherein the body region surrounds the element trench.

15. The trenched power semiconductor element according to claim 1, wherein the terminal dielectric layer further comprises a third dielectric material layer disposed between the second dielectric material layer and the terminal electrode.

\* \* \* \* \*